United States Patent [19]
Watanabe et al.

[11] Patent Number: 6,077,346
[45] Date of Patent: Jun. 20, 2000

[54] SEMICONDUCTOR SINGLE CRYSTAL GROWING APPARATUS AND CRYSTAL GROWING METHOD

[75] Inventors: Masahito Watanabe; Minoru Eguchi, both of Tokyo, Japan

[73] Assignee: NEC Corporation, Tokyo, Japan

[21] Appl. No.: 09/209,770

[22] Filed: Dec. 11, 1998

[30] Foreign Application Priority Data

Dec. 12, 1997 [JP] Japan .................................. 9-343261

[51] Int. Cl.[7] .................................................. C30B 15/00
[52] U.S. Cl. ............................. 117/32; 117/30; 117/208; 117/917
[58] Field of Search ................................. 117/13, 29, 32, 117/59, 30, 200, 208, 917

[56] References Cited

U.S. PATENT DOCUMENTS 5,797,990  8/1998  Li ........................................... 117/32 X

FOREIGN PATENT DOCUMENTS 63-60189  3/1988  Japan .

OTHER PUBLICATIONS

Keigo Hoshikawa et al., "Low Oxygen Content Czochralski Silicon Crystal Growth", *Japanese Journal of Applied Physics,* vol. 19, No. 1, Jan., 1980, pp. L33–36.

*Primary Examiner*—William Powell
*Attorney, Agent, or Firm*—Sughrue, Mion, Zinn, Macpeak & Seas, PLLC

[57] ABSTRACT

In the growth of a semiconductor single crystal according to the Czochralski method, a magnetic field is generated in a semiconductor melt and a current is supplied in the semiconductor melt in a direction perpendicular to the magnetic field. This makes it possible to cause the semiconductor melt to rotate spontaneously without rotating the crucible, thereby to grow a single crystal of semiconductor without striation even when growing a single crystal of semiconductor having a large diameter. Also it is made possible to exactly control the rotation rate of the semiconductor melt by changing the intensity of the magnetic field and the magnitude of the current independently. Further, the distribution of the rotation rates in the semiconductor melt can also be varied by changing the position of electrodes or electrode protecting tubes for immersing in the semiconductor melt.

21 Claims, 13 Drawing Sheets

SEMICONDUCTOR SINGLE CRYSTAL GROWING APPARATUS AND CRYSTAL GROWING METHOD

BACKGROUND OF THE INVENTION

1. Field of the Invention

The present invention relates to an apparatus for growing a semiconductor single crystal according to the Czochralski method, and a method of growing the same. More, particularly, the present invention relates to an apparatus for and a method of growing a crystal by rotating a semiconductor melt.

2. Description of the Related Art

Single crystal wafers of semiconductor used for substrates of ultra-high density electronic devices are made by growing the crystal according to the Czochralski method wherein the semiconductor single crystal is pulled up from a rotating semiconductor melt while rotating the single crystal in the direction opposite to that of the melt. The semiconductor melt held in a crucible is supplied with heat from a cylindrical heater disposed around the crucible. The crucible is rotated so as to make the temperatures in the melt due to the heat distributed in an axially symmetric configuration with respect to the pull shaft of the crystal. In order to make the temperature distribution in the melt axially symmetric sufficiently, the center of the crucible rotation and the center of the heater must correspond to the pull shaft of the crystal.

In the prior art, mechanical means has been predominantly employed for rotating the shaft which holds the crucible in the heater. Also, a method of supplying a current of different phase to a heater so that the semiconductor melt rotates spontaneously due to the rotating magnetic field generated thereby is disclosed in Japanese Journal of Applied Physics, vol.19 (1980), L33-36. Also, Japanese Patent Kokai Publication No. 63-60189 discloses a method of disposing several electromagnet coils around a crystal growing furnace so that the semiconductor melt rotates spontaneously due to the rotating magnetic field generated by changing the phase of the current supplied to the electromagnet coil.

However, these methods of rotating the semiconductor melt of the prior art have such problems as described below.

With the method of mechanically rotating the crucible holding shaft, when the semiconductor crystal to be grown is made as large as 30 cm in diameter, it is necessary to use 300 kg or more semiconductor melt, which leads to an inconveniently large apparatus. As the apparatus becomes larger, it becomes more difficult to rotate the crucible at a constant speed without the rotation shaft deviating from the center.

With the method of supplying alternating current to the heater, the heater temperature changes due to the alternating current which in turn causes variations in the semiconductor melt temperature. Also this method gives rise to such problems as the deformation of the heater due to the alternating current thus making it necessary to reinforce the heater in the case of large single crystal of semiconductor, and is not suited for growing single crystal of a large diameter.

The method of generating a rotating magnetic field by means of the electromagnet coils requires it to control the phase of the current supplied to the coils in order to achieve constant rotation of the magnetic field and to control the positional relationship of the coils accurately, and moreover it is difficult to control the rotation rate to a desired value.

Thus when a semiconductor single crystal having a large diameter of 30 cm or greater is to be grown with the prior art technologies, temperature distribution in the interface of crystal growth becomes asymmetrical with respect to the pull shaft unless the rotation axis of the semiconductor melt corresponds completely with the pull shaft, leading to asymmetric distribution of temperatures in the interface of crystal growth and uneven distribution of impurities in the single crystal which has been grown resulting in striation.

SUMMARY OF THE INVENTION

It is an object of the present invention to provide a crystal growing apparatus and a crystal growing method according to the Czochralski method of growing semiconductor single crystal which are capable of minimizing the increase in the size of the apparatus even when a semiconductor single crystal having a large diameter of 30 cm or greater is grown, accurately controlling the rotation rate and achieving favorable temperature distribution in the semiconductor melt.

The present invention provides a semiconductor single crystal growing apparatus according to the Czochralski method, comprising a device for generating a magnetic field in a semiconductor melt and a device for supplying a current in the semiconductor melt in a direction perpendicular to the magnetic field.

The present invention also provides a semiconductor single crystal growing method according to the Czochralski method, which comprises generating a magnetic field in a semiconductor melt and supplying a current in the semiconductor melt in a direction perpendicular to the magnetic field.

According to the present invention, by generating the magnetic field in the semiconductor melt and supplying the current in a direction perpendicular to the magnetic field when growing the semiconductor single crystal according to the Czochralski method, the crystal can be grown while the semiconductor melt rotates spontaneously without rotating the crucible.

Also according to the present invention, the rotation rate of the semiconductor melt can be freely set by changing the intensity of the magnetic field and the magnitude of the current as desired.

Also according to the present invention, distribution of the rotation rates in the semiconductor melt can be varied by changing the position of an electrode or an electrode protecting tube which is put into the semiconductor melt. This makes it possible to easily control the changes in the concentrations of impurity elements which mix into the crystal.

With the method of the present invention wherein the semiconductor melt is caused to rotate spontaneously, since the axis of rotation of the semiconductor melt completely agrees with the pull shaft of the crystal, temperature distribution in the melt becomes symmetrical with respect to the crystal pull shaft and therefore striation is not generated in the crystal which is grown.

DETAILED DESCRIPTION OF THE PREFERRED EXAMPLES

Figure 1:
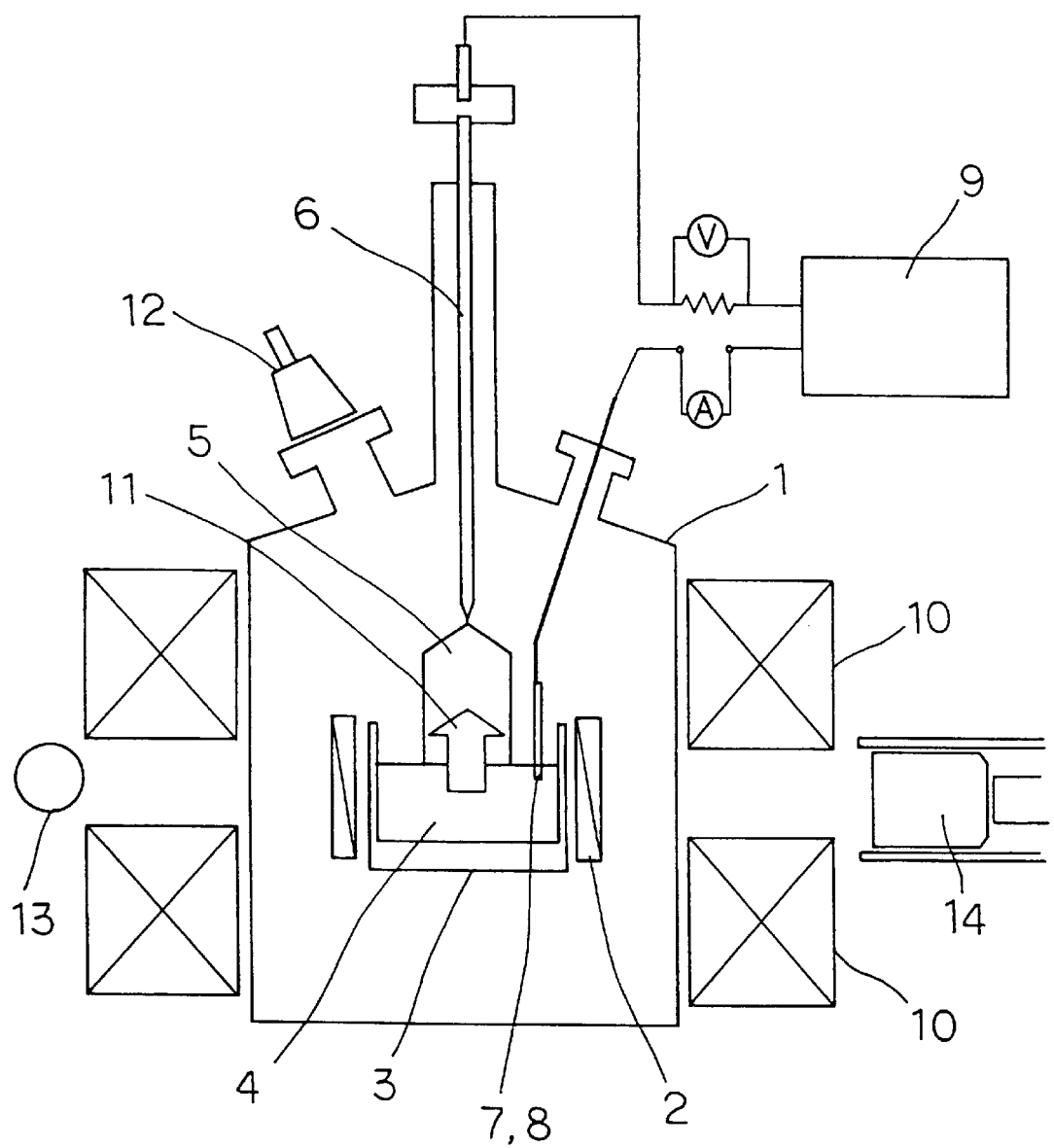
FIG. 1 is a diagram showing the construction of the semiconductor single crystal growing apparatus of the present invention.
Figure 2:
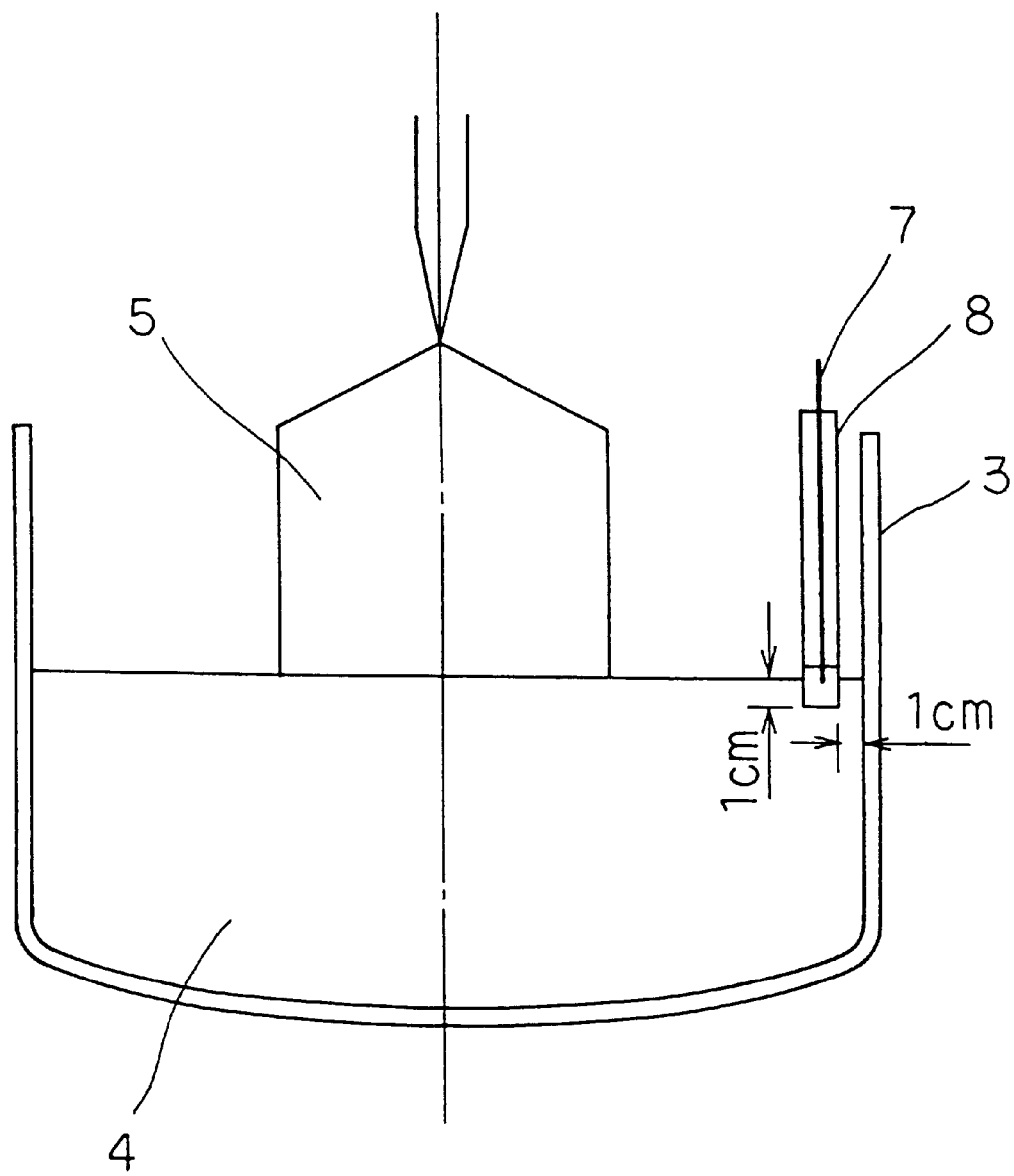
FIG. 2 is a diagram for explaining the immersion position of the electrode when growing a single crystal silicon having a diameter of 3.0 cm in Example 1 of semiconductor single crystal growing according to the present invention.
Figure 3:
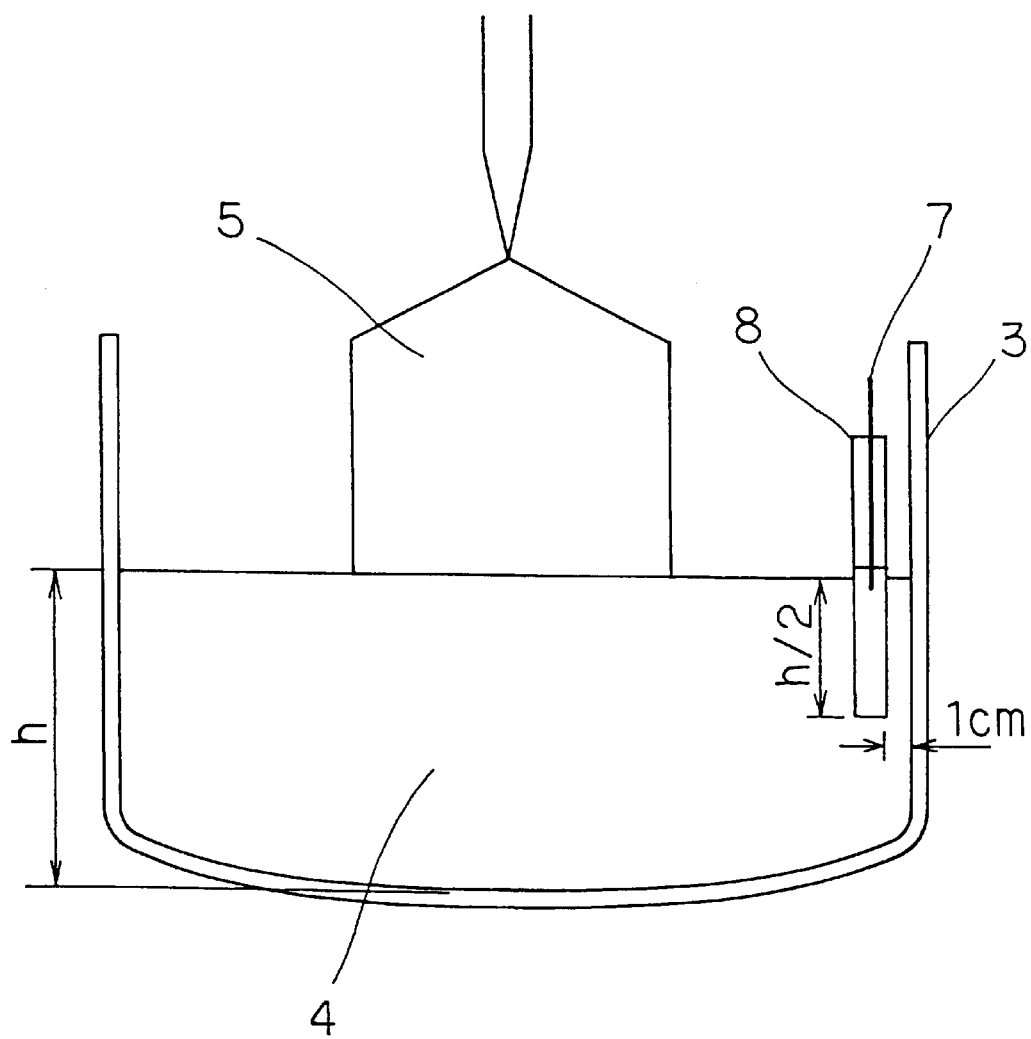
FIG. 3 is a diagram for explaining the immersion position of the electrode when growing a single crystal silicon having a diameter of 3.0 cm in Example 2 of semiconductor single crystal growing according to the present invention.
Figure 4:
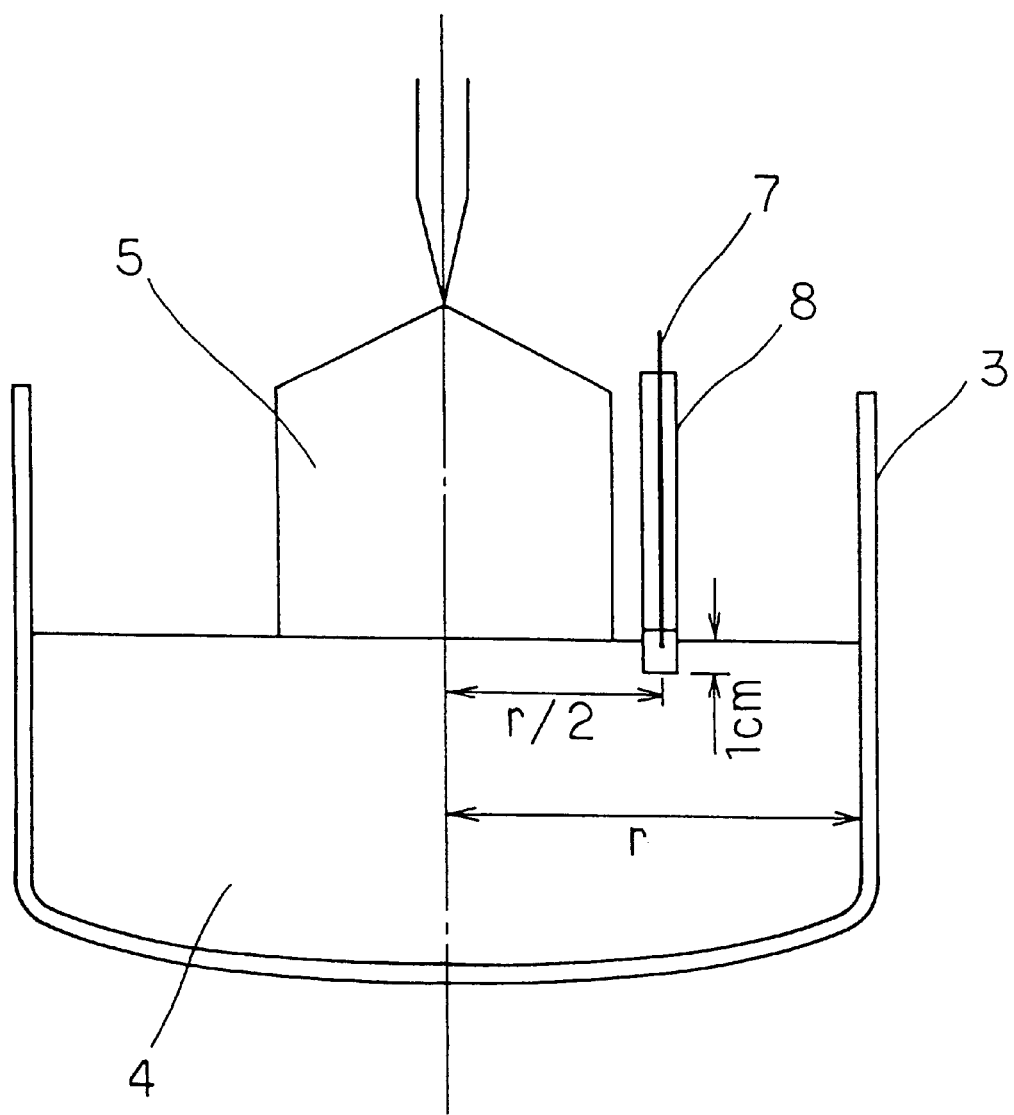
FIG. 4 is a diagram for explaining the immersion position of the electrode when growing a single crystal silicon having a diameter of 3.0 cm in Example 3 of semiconductor single crystal growing according to the present invention.
Figure 5:
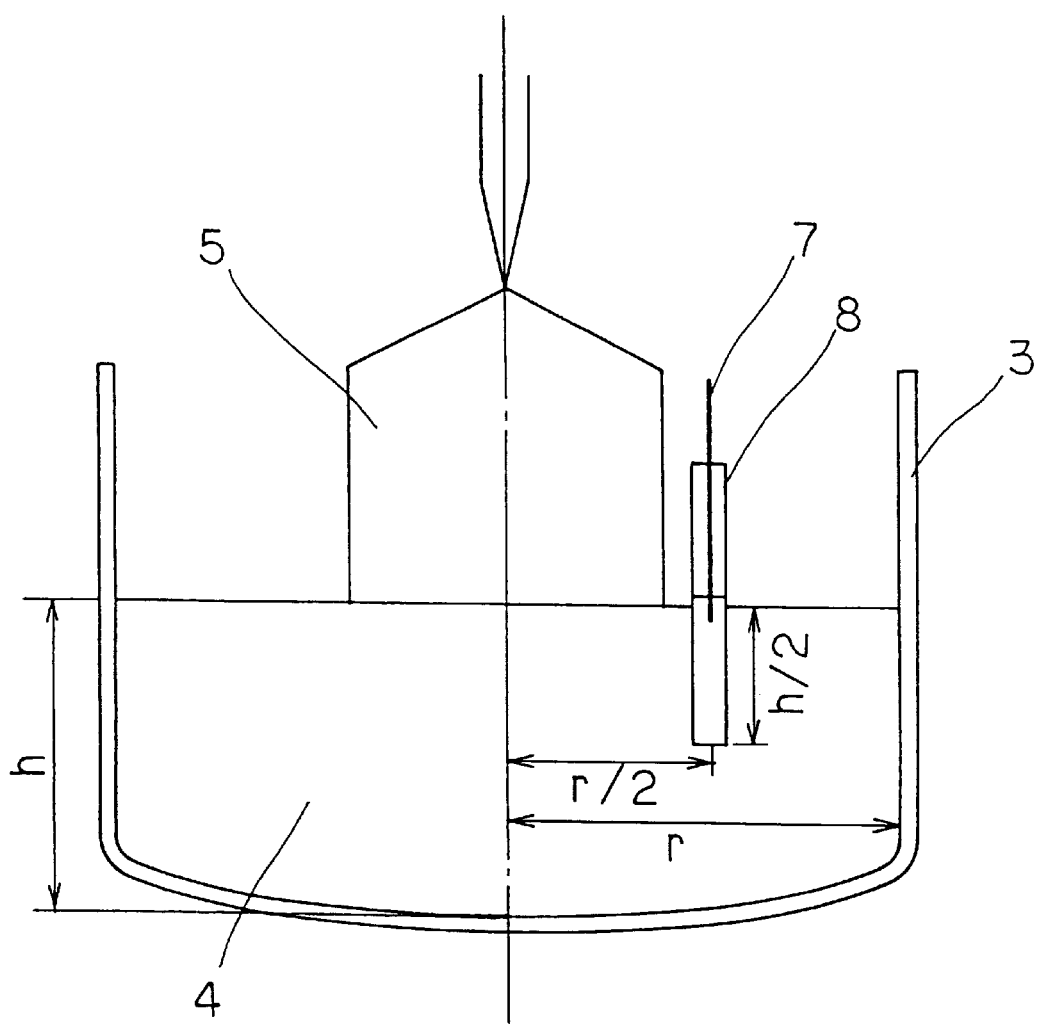
FIG. 5 is a diagram for explaining the immersion position of the electrode when growing a single crystal silicon having a diameter of 3.0 cm in Example 4 of semiconductor single crystal growing according to the present invention.

The present invention makes use of such a principle that a current flowing in a semiconductor melt residing in a magnetic field causes Lorentz force to be exerted on the semiconductor melt, thereby causing the semiconductor melt to rotate spontaneously. This makes it possible to cause the semiconductor melt to rotate without rotating the crucible.

Consequently, even when a semiconductor melt of 300 kg or more is used to grow a semiconductor single crystal having a diameter of 30 cm or greater, the semiconductor melt can be easily rotated about an axis of rotation which agrees with the crystal pull shaft without scaling up the apparatus.

Also the rotation rate of the semiconductor melt can be changed freely by changing the intensity of the magnetic field and the magnitude of the current. With this respect, the intensity of the magnetic field and the magnitude of the current can be changed independently thus making it possible to control the rotation rate more accurately.

Also when supplying current through the semiconductor single crystal and the semiconductor melt, distribution of the rotation rate in the semiconductor melt can be varied by changing the position of an electrode or an electrode protecting tube which is put into the semiconductor melt.

Now preferred embodiments of the present invention will be described below.

One embodiment of the single crystal growing apparatus according to the present invention comprises a device for generating a magnetic field which is perpendicular to the interface of crystal growth and is axially symmetrical with respect to a pull shaft of the crystal, and a device for supplying a current in the semiconductor melt in a direction perpendicular to the magnetic field.

The device for supplying current includes, for example, a device comprising an electrode for immersing in the semiconductor melt and an electrode for supplying current to the crystal to be pulled up.

The electrode for immersing in the semiconductor melt may be provided in plurality, with the electrodes being disposed in an axially symmetrical configuration with respect to the pull shaft of the crystal.

The electrode immersed in the semiconductor melt may also be made in a closed curve having a symmetrical configuration with respect to the pull shaft of the crystal.

The semiconductor single crystal growing apparatus of the present invention may also have such a configuration that a tip of the electrode is immersed in the semiconductor melt near the surface thereof at a constant depth when the crystal is pulled up.

The semiconductor single crystal growing apparatus of the present invention may also have such a configuration that the electrode protecting tube immersed in the semiconductor melt is kept at a constant depth when the crystal is pulled up.

The semiconductor single crystal growing apparatus of the present invention may also have such a configuration that the ratio of the electrode protecting tube immersed in the semiconductor melt to the depth of the semiconductor melt is kept constant when the crystal is pulled up.

The semiconductor single crystal growing apparatus of the present invention may also have such a configuration that has a device for generating a magnetic field, which is parallel to the interface of crystal growth, and a device for supplying current to flow in a direction perpendicular to the magnetic field in the semiconductor melt.

The semiconductor single crystal growing apparatus of the present invention may also have such a configuration that has a device for generating a cusped magnetic field and a device for supplying current to flow in a direction perpendicular to the magnetic field in the semiconductor melt.

In one embodiment of the semiconductor single crystal growing method according to the present invention, a magnetic field perpendicular to the interface of crystal growth is generated and a current is supplied to flow in a direction perpendicular to the magnetic field in the semiconductor melt.

The magnetic field perpendicular to the interface of crystal growth may be formed in a configuration axially symmetrical with respect to the crystal pull shaft.

According to the crystal growing method of the present invention, the crystal may also be pulled up while keeping the surface of the semiconductor melt in an optimum configuration by changing the intensity of the magnetic field during the crystal growth. The crystal may also be pulled up while keeping the surface of the semiconductor melt in an optimum configuration by changing the magnitude of the current during crystal growth.

According to the crystal growing method of the present invention, the crystal may also be pulled up while keeping the depth of the tip of the electrode immersed in the semiconductor melt constant, in the vicinity of the surface of the semiconductor melt.

The crystal may also be pulled up while keeping the electrode protecting tube immersed in the semiconductor melt near the surface thereof at a constant depth.

The crystal may also be pulled up while keeping a ratio of the depth of the electrode protecting tube immersed in the semiconductor melt to the depth of the semiconductor melt constant.

The rotation rate of the semiconductor melt can also be varied in the radial direction of the crucible filled with the semiconductor melt or in the direction of depth.

According to the crystal growing method of the present invention, the magnetic field may be generated in parallel to the interface of crystal growth while supplying the current to flow in a direction perpendicular to the magnetic field in the semiconductor melt.

According to the crystal growing method of the present invention, a cusped magnetic field may be generated while supplying the current in a direction perpendicular to the magnetic field in the semiconductor melt.

One embodiment of the semiconductor single crystal growing apparatus of the present invention will now be described below with reference to FIG. 1.

A crucible 3 is placed in a heater 2 installed in a crystal growing furnace 1, thereby to make a semiconductor melt 4. A semiconductor single crystal 5 is pulled up from the semiconductor melt by means of a pull-up shaft 6 made of an electrically conductive material. While a seed crystal and the pull-up shaft are coupled in the ordinary way employed when growing a crystal according to the Czochralski method, it is preferable to provide a large contact area between the seed crystal and the pull-up shaft, in order to maintain satisfactory electrical continuity.

While the semiconductor single crystal is grown, a current is supplied to flow between the semiconductor single crystal being growing and the semiconductor melt in the crucible. For this purpose, an electrode 7 with one end thereof being inserted in an open protective tube 8 made of quartz or p-BN (pyrolytic boron nitride) is put into the semiconductor melt and current is supplied from an external power source 9 while growing the semiconductor single crystal. In this process, a magnetic field 11 which is perpendicular to the interface of crystal growth and is axially symmetric with respect to the pull shaft is generated by a electromagnet coil 10 disposed around the crystal growing furnace, so that the magnetic field penetrates the semiconductor melt. Rotation of the semiconductor melt and the growth of the crystal are monitored by means of a CCD camera 12 installed on top of the crystal growing furnace 1, in order to control the intensity of the magnetic field and the current so that the semiconductor melt rotates at a desired speed. Also the cross sectional configuration of the semiconductor melt is monitored by means of an X-ray source 13 and an X-ray camera 14 installed on side walls of the crystal growing furnace 1, in order to control the intensity of the magnetic field and the current so that the semiconductor melt surface is kept in a desired shape.

Examples carried out by using the apparatus described above will be described below.

EXAMPLES 1 to 4

0.3 kg of a silicon melt was made in a crucible having a diameter of 7.5 cm, and an electrode rod made of graphite having a diameter of 0.4 cm inserted in a protective tube made of quartz was put into the silicon melt. Thus a single crystal of silicon having a diameter of 3 cm was grown while verifying the effect of the present invention to cause the semiconductor melt to rotate spontaneously. The graphite electrode was put into contact with the silicon melt inside the quartz protective tube.

In Examples 1 to 4, an electrode was put into the silicon melt and a crystal was grown while changing the position of the electrode or the protective tube. The positions of tip of the protective tube housing the electrode in the different Examples were set as follows as shown in FIGS. 2 to 5. In Example 1 (FIG. 2), the protective tube was kept at a distance of 1 cm from the crucible wall and a depth of 1 cm from the surface of the melt. In Example 2 (FIG. 3), the protective tube was kept at a distance of 1 cm from the crucible wall and a depth of half (h/2) the depth of the melt (h). In Example 3 (FIG. 4), the protective tube was kept at a distance of half (r/2) the radius of the silicon melt (r) and a depth of 1 cm from the surface of the melt. In Example 4 (FIG. 5), the protective tube was kept at a distance of half (r/2) the radius of the silicon melt (r) and a depth of a half (h/2) the depth of the melt (h).

EXAMPLES 5 to 7

300 kg of silicon melt was made in a crucible having a diameter of 75 cm, and an electrode rod made of graphite having a diameter of 0.4 cm inserted in a protective tube made of quartz was put into the silicon melt, to grow a single crystal of silicon 30 cm in diameter.

Figure 6:
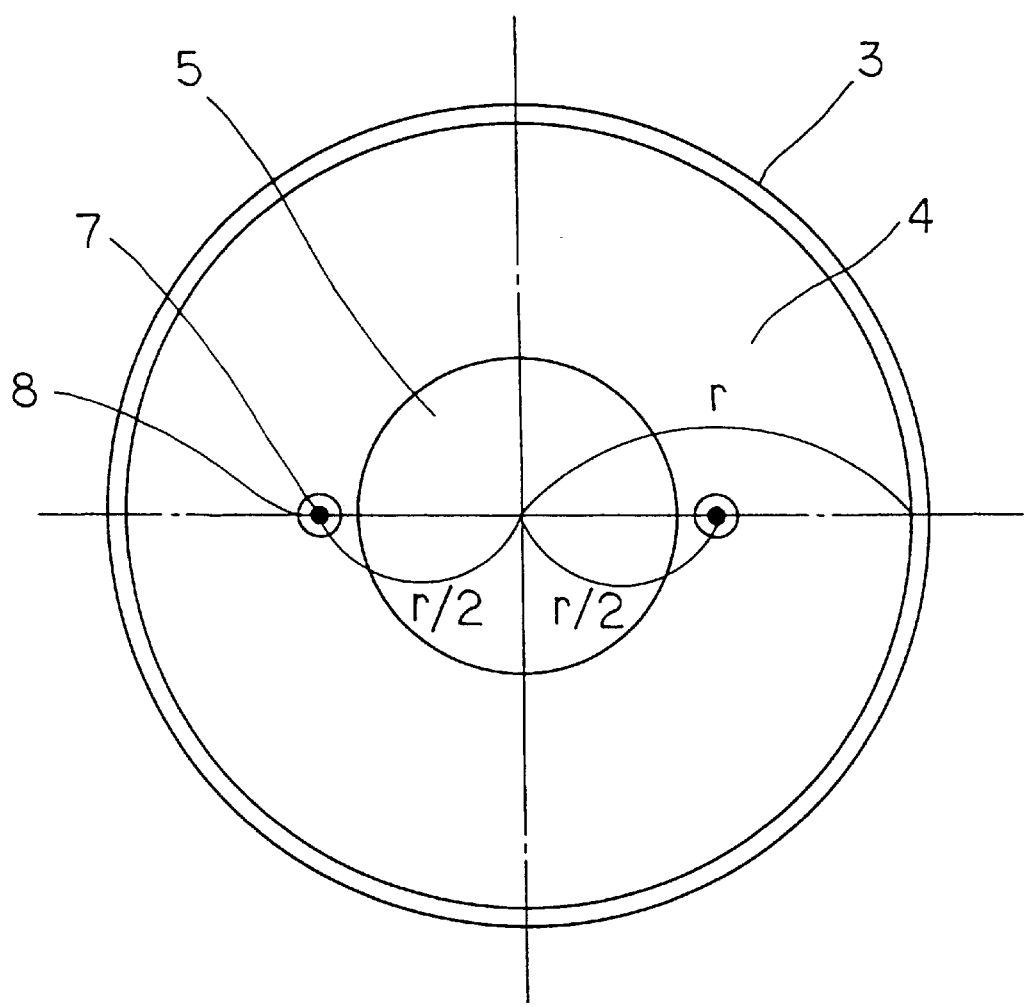
FIG. 6 is a diagram for explaining the immersion position of the electrodes when growing a single crystal silicon having a diameter of 30.0 cm in Example 5 of semiconductor single crystal growing according to the present invention.
Figure 7:
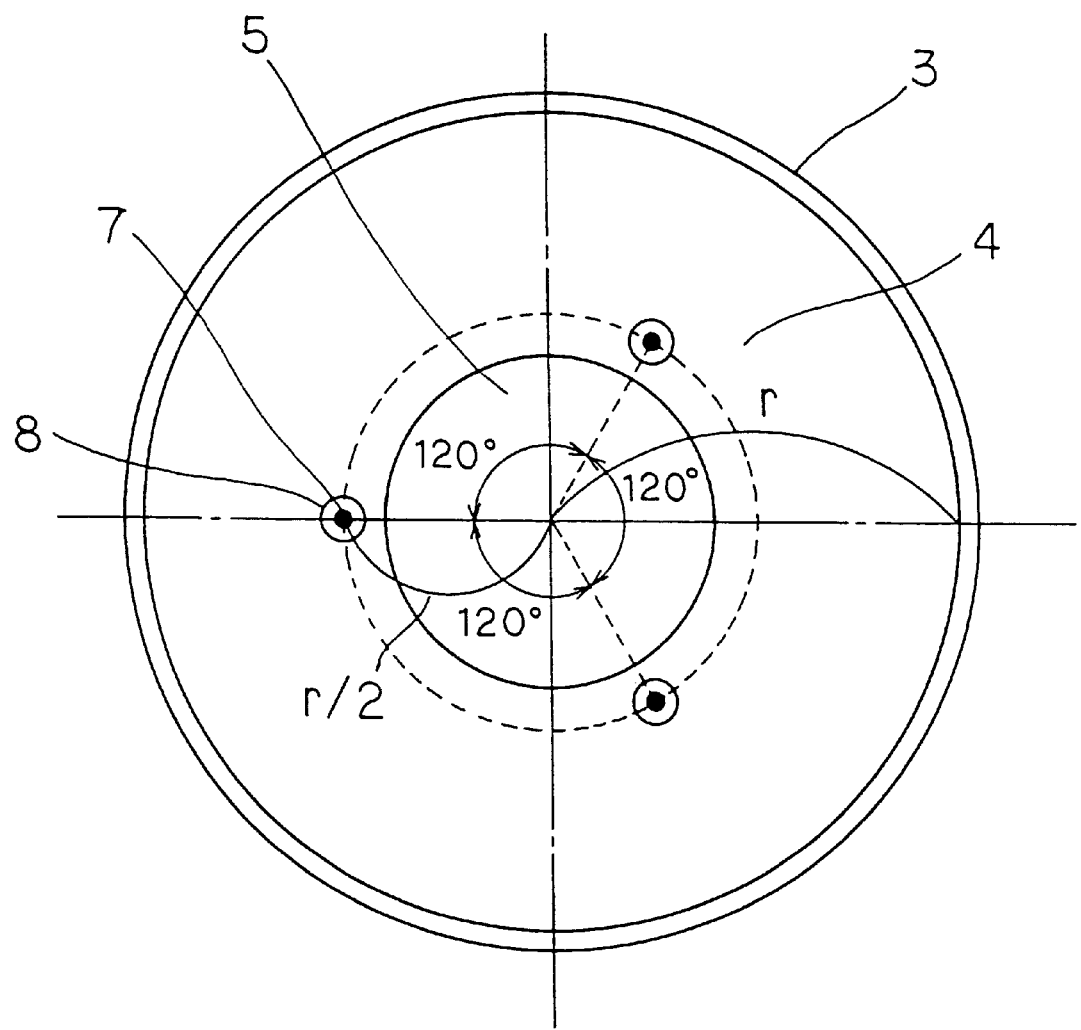
FIG. 7 is a diagram for explaining the immersion position of the electrodes when growing a single crystal silicon having a diameter of 30.0 cm in Example 6 of semiconductor single crystal growing according to the present invention.
Figure 8:
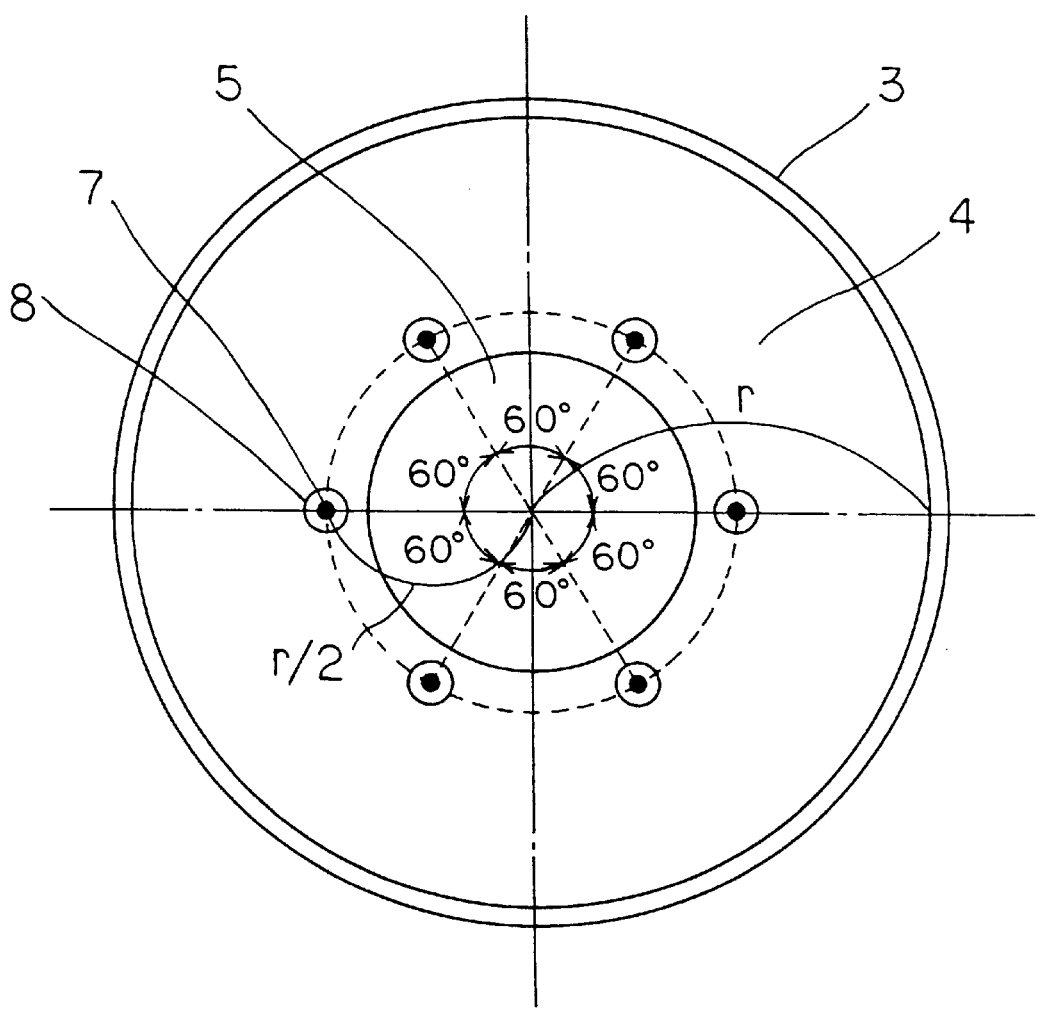
FIG. 8 is a diagram for explaining the immersion position of the electrodes when growing a single crystal silicon having a diameter of 30.0 cm in Example 7 of semiconductor single crystal growing according to the present invention.

In these Examples, crystals were grown while changing the number of electrodes immersed in the melt as follows. In Example 5, two protective tubes which house the electrodes were immersed to a depth of 1 cm from the surface of the melt with the centers thereof being positioned at half (r/2) the radius of the silicon melt (r) and disposed on a diameter of the crucible, as shown in FIG. 6. In Example 6, three protective tubes housing the electrodes were immersed to a depth of 1 cm from the surface of the melt with the centers thereof being positioned at half (r/2) the radius of the silicon melt (r) and spaced at equal intervals of 120 degrees around the center of the crucible, as shown in FIG. 7. In Example 7, six protective tubes housing the electrodes were immersed to a depth of 1 cm from the surface of the melt with the centers thereof being positioned at half (r/2) the radius of the silicon melt (r) and spaced at equal intervals of 60 degrees around the center of the crucible, as shown in FIG. 8.

EXAMPLE 8

Figure 9:
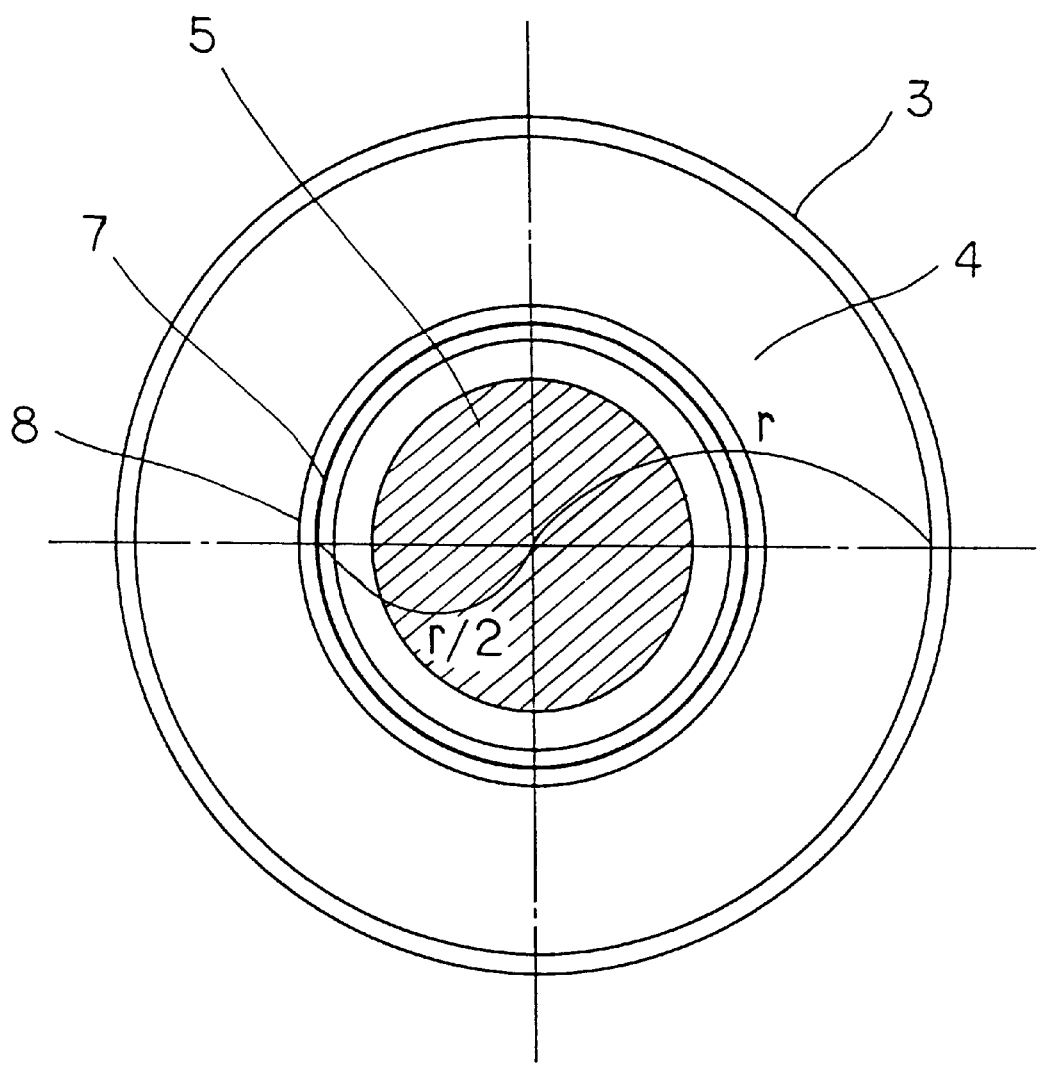
FIG. 9 is a diagram for explaining the electrode and immersion position of the electrode when growing a single crystal silicon having a diameter of 40.0 cm in Example 8 of semiconductor single crystal growing according to the present invention.

In this Example, a circular ring having an inner radius which is the half(r/2) the radius of the silicon melt (r) was used as the electrode 7, as shown in FIG. 9. Center line of this ring was made to correspond with the pull shaft of the crystal. A protective tube 8 was immersed into the silicon melt with the lower end thereof at a depth of 1 cm from the surface of the melt, thereby growing a crystal.

EXAMPLE 9

In this Example, a single crystal of silicon 40 cm in diameter was grown by using a quartz crucible having a diameter of 100 cm. Three protective tubes housing carbon electrodes having a diameter of 0.4 mm were immersed to a depth of 1 cm from the surface of the melt with the centers thereof being positioned at half (r/2) the radius of the silicon melt (r) and spaced at equal intervals of 120 degrees around the center of the crucible, as in the case of the sixth Example (FIG. 7), thereby growing a crystal.

Intensity of the magnetic field, magnitude of the current and other conditions of crystal growth in the Examples described above are summarized in Table 1. Rotation rates of the semiconductor melt and the striation observed in the crystals which were grown in Examples 1 to 9 are summarized in Table 2.

TABLE 1

|  | Crystal diameter (cm) | Crucible diameter (cm) | Amount of melt (kg) | Crystal rotation rate (rpm) | Magnetic field intensity (T) | Current (A) |
|---|---|---|---|---|---|---|
| Example 1 | 3.0 | 7.5 | 0.3 | 10.0 | 0.01~0.5 | 0.1~20 |
| Example 2 | 3.0 | 7.5 | 0.3 | 10.0 | 0.01~0.5 | 0.1~20 |
| Example 3 | 3.0 | 7.5 | 0.3 | 10.0 | 0.01~0.5 | 0.1~20 |
| Example 4 | 3.0 | 7.5 | 0.3 | 10.0 | 0.01~0.5 | 0.1~20 |
| Example 5 | 30.0 | 75.0 | 300.0 | 10.0 | 0.01~1.0 | 0.1~40 |
| Example 6 | 30.0 | 75.0 | 300.0 | 10.0 | 0.01~1.0 | 0.1~40 |
| Example 7 | 30.0 | 75.0 | 300.0 | 10.0 | 0.01~1.0 | 0.1~40 |
| Example 8 | 30.0 | 75.0 | 300.0 | 10.0 | 0.01~1.0 | 0.1~40 |
| Example 9 | 40.0 | 100.0 | 400.0 | 10.0 | 0.01~1.0 | 0.1~40 |

TABLE 2

|  | Maximum melt rotation rate (rpm) | Minimum melt rotation rate (rpm) | Absence or presence of striation |
|---|---|---|---|
| Example 1 | 3000 | 0.01 | None |
| Example 2 | 3000 | 0.01 | None |
| Example 3 | 3000 | 0.01 | None |
| Example 4 | 3000 | 0.01 | None |
| Example 5 | 5000 | 0.01 | None |
| Example 6 | 5000 | 0.01 | None |
| Example 7 | 5000 | 0.01 | None |
| Example 8 | 5000 | 0.01 | None |
| Example 9 | 5000 | 0.01 | None |

The rotation of the semiconductor melt was monitored by observing tracer particles suspended on the surface of the semiconductor melt with a CCD camera installed on top of the furnace. Results of observation of the rotating semiconductor melt is summarized in FIG. 10 together with the traveling speed of the tracer particles represented by the length of arrow for each position of the electrode immersed in the melt.

FIG. 10(a) shows Example 1 where the tip of the electrode protecting tube is positioned at a distance of 1 cm from the crucible wall and a depth of 1 cm, and indicates that every part of the semiconductor melt rotates at almost the same speed.

FIG. 10(b) shows Example 2 where the tip of the electrode protecting tube is positioned at a distance of 1 cm from the crucible wall and a depth (h/2) of half the semiconductor melt depth (h). The rotation rate of the melt was slower than that of Example 1 near the surface, but was similar to that of Example 1 throughout the melt in deeper portions.

FIG. 10(c) shows Example 3 and Examples 5 to 10 where tip of the electrode protecting tube is positioned at half (r/2) the radius (r) of the melt and a depth of 1 cm. The rotation rate of the melt was faster than that of Example 1 near the surface in the vicinity of single crystal silicon, but was very slow near the crucible wall.

FIG. 10(d) shows Example 4 where tip of the electrode protecting tube is positioned at half (r/2) the radius (r) of the melt from the crucible wall and a depth (h/2) half the depth of the melt (h). The rotation rate of the melt was slow near the surface in the vicinity of the single crystal silicon, and the melt hardly rotated near the crucible wall. Deeper in the melt, the melt rotated faster in the vicinity of single crystal silicon, but hardly rotated near the crucible wall.

These Examples show that the method of the present invention is capable of rotating the semiconductor melt in a range up to 5000 rpm with an accuracy of 0.01 rpm. Also the semiconductor single crystal grown by the method of this invention does not include striation generated therein, indicating that the semiconductor melt rotates around an axis which completely agrees with the crystal pull shaft.

Figure 10:
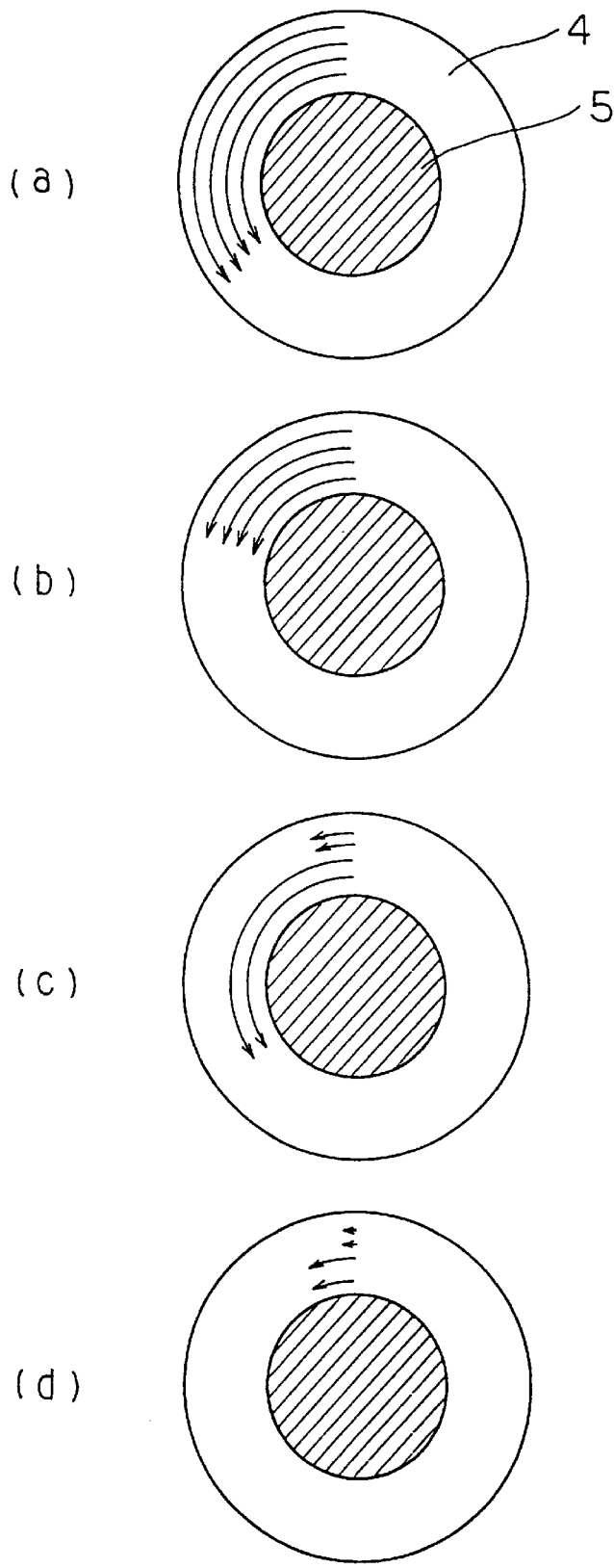
FIGS. 10 (a–d) are diagrams showing the results of observing the rotating silicon melt in the semiconductor single crystal growing process (Examples 1 to 9) according to the present invention. Length of arrow represents the magnitude of the traveling speed.

From FIG. 10 which shows the observation of the rotation of the melt, it is verified that distribution of the rotation rates in the semiconductor melt can be varied with the position of immersing the electrode or the electrode protecting tube.

Comparative Examples 1 to 3

In order to substantiate the effect of the present invention, the results of growing single crystal silicon carried out by the prior art method wherein the crucible was rotated mechanically are described below as Comparative Examples.

In Comparative Example 1, single crystal silicon having a diameter of 3.0 cm was grown by using a quartz crucible having a diameter of 7.5 cm. The rotation rate of the crucible was changed from 0.1 rpm to 20 rpm.

In Comparative Example 2, a single crystal silicon having a diameter of 30 cm was grown by using a quartz crucible having a diameter of 75 cm, similarly to Example 5. The rotation rate of the crucible was changed from 0.1 rpm to 20 rpm.

In Comparative Example 3, a single crystal silicon having a diameter of 40 cm was grown by using a quartz crucible having a diameter of 100 cm, similarly to Example 9, while changing rotation rate of the crucible from 0.1 rpm to 20 rpm.

Crystal growing conditions and the results of observing striation in the crystals grown thereby are summarized in Table 3.

TABLE 3

|  | Crystal diameter (cm) | Crucible diameter (cm) | Amount of melt (kg) | Crystal rotation rate (rpm) | Crucible rotation rate (rpm) | Presence or absence of striation |
|---|---|---|---|---|---|---|
| Comp. Example 1 | 3.0 | 7.5 | 0.3 | 10.0 | 0.1~20 | Recognized |

TABLE 3-continued

|  | Crystal diameter (cm) | Crucible diameter (cm) | Amount of melt (kg) | Crystal rotation rate (rpm) | Crucible rotation rate (rpm) | Presence or absence of striation |
|---|---|---|---|---|---|---|
| Comp. Example 2 | 30.0 | 75.0 | 300.0 | 10.0 | 0.1~20 | Recognized |
| Comp. Example 3 | 40.0 | 100.0 | 400.0 | 10.0 | 0.1~20 | Recognized |

These Comparative Examples show that single crystals of silicon grown by the conventional method of rotating the crucible involve striation generated therein with the temperatures in the silicon melt being distributed in an asymmetric configuration with respect to the pull shaft of the crystal, and that it is difficult to achieve exactly axially symmetric distribution of temperature in the melt by rotating the crucible.

EXAMPLES 10 and 11

In order to verify that the present invention can be applied to the growth of single crystals of semiconductors other than silicon, a single crystal of GaAs having a diameter of 15 cm was grown by using a p-BN crucible having a diameter of 30 cm as Example 10, with electrodes arrangement similar to that of Example 7. As Example 11, a single crystal of GaP having a diameter of 10 cm was grown by using a p-BN crucible having diameter of 25 cm, with similar arrangement of electrodes. The results are shown in Table 4.

TABLE 4

|  | Kind of single crystal | Crystal diameter (cm) | Crucible diameter (cm) | Crystal rotation rate (rpm) | Magnetic field intensity (T) | Current (A) | Presence or absence of striation |
|---|---|---|---|---|---|---|---|
| Example 10 | GaAs | 15.0 | 30.0 | 10.0 | 0.01~0.5 | 0.1~40 | None |
| Example 11 | GaP | 10.0 | 25.0 | 10.0 | 0.01~0.5 | 0.1~40 | None |

These results show that the semiconductor melt can be caused to rotate spontaneously when growing a single crystal of a semiconductor other than silicon according to the present invention. It was also verified that the generation of striation in the semiconductor single crystal can be suppressed.

The method of generating the magnetic field, the electrode immersed in the melt and the electrode connected to the crystal of the present invention are not limited to the structures, materials and methods of the Examples described above, and the present invention covers any structures, materials and methods which enable it to generate a magnetic field which is perpendicular to the melt surface and supply current flowing in a direction perpendicular to the magnetic field.

EXAMPLES 12 and 13

Although Examples 1–11 deal mainly with cases where the magnetic field is directed at right angles to the crystal growth surface, there are no limitations on the direction of the magnetic field as far as a current in the semiconductor melt in a direction perpendicular to the magnetic field, and cusped magnetic field or horizontal magnetic field, for example, may be employed according to the present patent application.

Figure 11A:
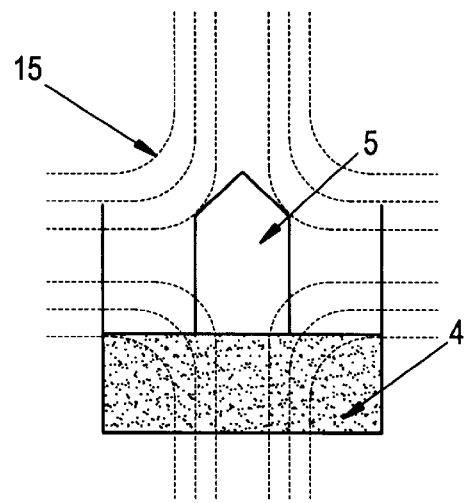
FIGS. 11(a–c) are diagrams for explaining the configuration of a cusped magnetic field when growing a single crystal silicon having a diameter of 30.0 cm in Example 12 of semiconductor single crystal growing according to the present invention.
Figure 11B:
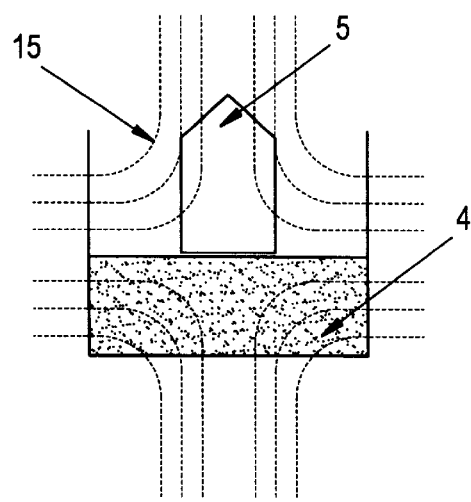
Figure 11C:
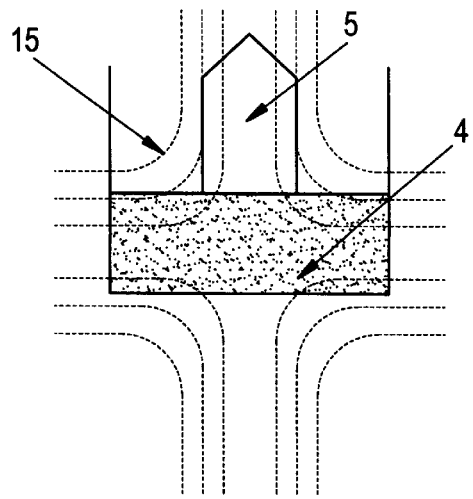

In order to verify this, in Example 12, a single crystal of silicon 30.0 cm in diameter was grown by using a quartz crucible having a diameter of 75 cm while generating a cusped magnetic field, with the electrodes arranged similarly to that of Example 7. The cusped magnetic field was generated in three different configurations shown in FIG. 11(a) to (c).

Figure 12A:
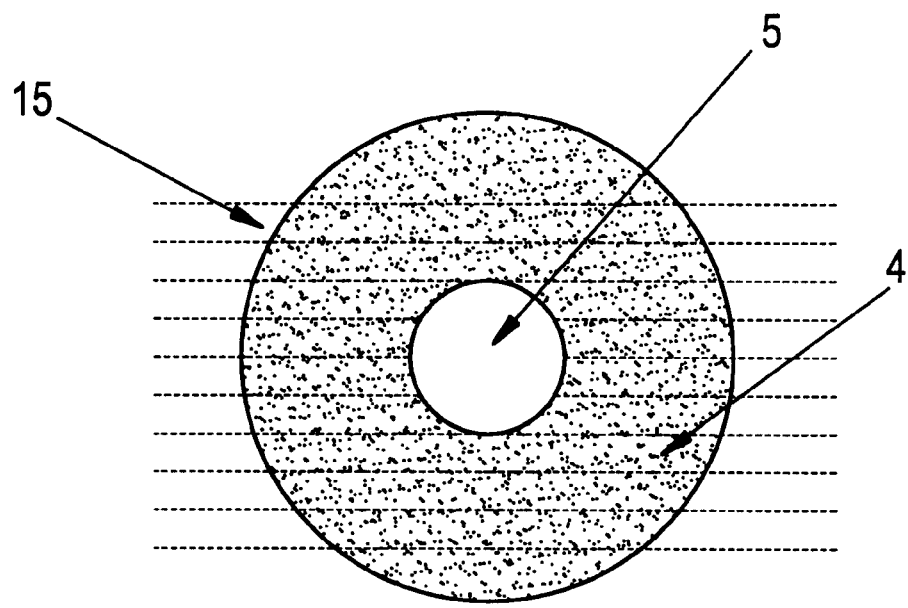
FIGS. 12(a–b) are diagrams for explaining the position of ?0r/s horizontal magnetic field when growing a single crystal silicon having a diameter of 30.0 cm in Example 13 of semiconductor single crystal growing according to the present invention.
Figure 12B:
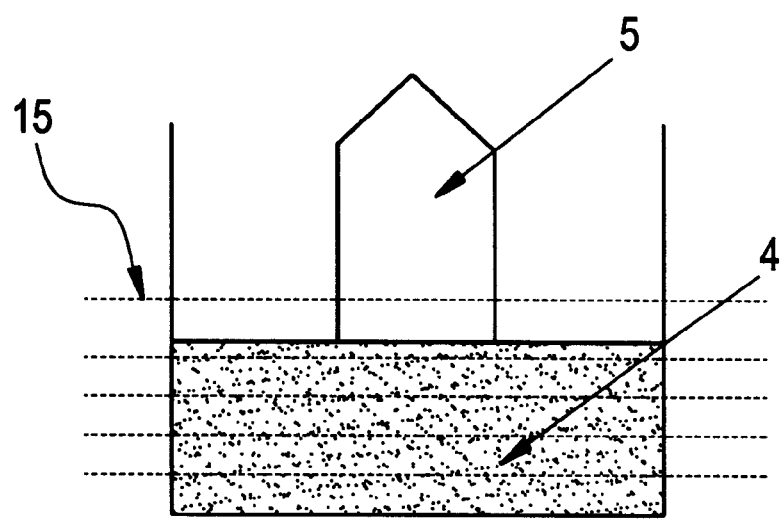
Figure 13:
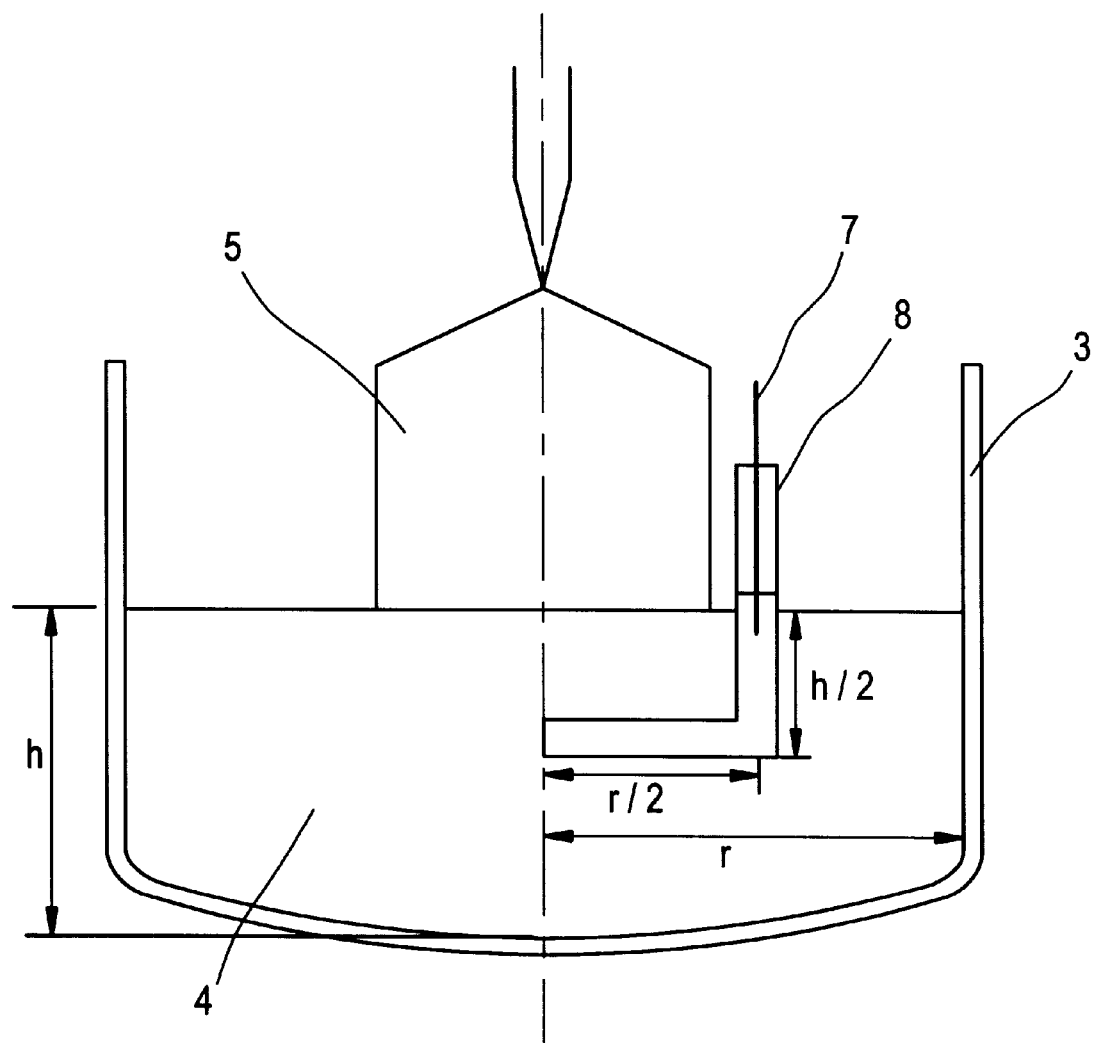
FIG. 13 is a diagram for explaining the position of immersing the electrode when growing a single crystal silicon having a diameter of 30.0 cm in Example 13 of semiconductor single crystal growing according to the present invention.

As Example 13, as shown in FIG. 12, a single crystal of silicon having a diameter of 30.0 cm was grown by using a quartz crucible having a diameter of 75 cm while generating a horizontal magnetic field which was perpendicular to the direction of lifting the crystal, with the electrodes arranged as shown in FIG. 13. FIG. 12(a) is a plan view and FIG. 12(b) is a side view of the apparatus.

Results of Examples 12 and 13 are summarized in Table 5. From these results it can be verified that the effect of the present invention can be achieved as far as a current in the semiconductor melt in a direction perpendicular to the magnetic field regardless of the configuration of the magnetic field.

TABLE 5

|  | Crystal rotation rate (rpm) | Magnetic field intensity (T) | Current (A) | Melt rotation rate (rpm) | Presence or absence of striation |
|---|---|---|---|---|---|
| Example 12 | 10.0 | 0.01~0.5 | 0.1~20 | 0.01~3000 | None |
| Example 13 | 10.0 | 0.01~0.5 | 0.1~20 | 0.01~3000 | None |

What is claimed is:

1. A semiconductor single crystal growing device according to the Czochralski method, comprising a device for generating a magnetic field in a semiconductor melt and a device for supplying a current in the semiconductor melt in a direction perpendicular to the magnetic field.

2. The semiconductor single crystal growing device according to claim 1, comprising a device for generating a magnetic field, which is perpendicular to a crystal growth interface and is axially symmetric with respect to a crystal pull shaft in the semiconductor melt, and a device for supplying a current in the semiconductor melt in a direction perpendicular to the magnetic field.

3. The semiconductor single crystal growing device according to claim 2, comprising an electrode for immersing in the semiconductor melt and an electrode for supplying a current to the crystal to be pulled up.

4. The semiconductor single crystal growing device according to claim 3, wherein the electrode for immersing in the semiconductor melt is provided in plurality with the electrodes arranged in an axially symmetrical configuration with respect to the pull shaft of the crystal.

5. The semiconductor single crystal growing device according to claim 3, wherein the electrode for immersing in the semiconductor melt is made in a closed curve having an axially symmetrical configuration with respect to the pull shaft of the crystal.

6. The semiconductor single crystal growing device according to claim 3, wherein a tip of the electrode is immersed in the semiconductor melt near the surface thereof at a depth kept constant while the crystal is pulled up.

7. The semiconductor single crystal growing device according to claim 3, wherein the depth of an electrode protecting tube immersed in the semiconductor melt is kept constant while the crystal is being pulled up.

8. The semiconductor single crystal growing device according to claim 3, wherein a ratio of the depth of the electrode protecting tube immersed in the semiconductor melt to the depth of the melt is kept constant while the crystal is pulled up.

9. A semiconductor single crystal growing method according to the Czochralski method, which comprises generating a magnetic field in a semiconductor melt and supplying a current in the semiconductor melt in a direction perpendicular to the magnetic field.

10. The semiconductor single crystal growing method according to claim 9, wherein the magnetic field perpendicular to a crystal growth interface is generated and the current is supplied in the semiconductor melt in a direction perpendicular to the magnetic field.

11. The semiconductor single crystal growing method according to claim 10, wherein the magnetic field perpendicular to the crystal growth interface has a configuration axially symmetric with respect to the crystal pull shaft.

12. The semiconductor single crystal growing method according to claim 10, wherein the semiconductor melt surface is maintained in an optimum configuration by changing the intensity of the magnetic field during the crystal growth while the crystal is pulled up.

13. The semiconductor single crystal growing method according to claim 10, wherein the semiconductor melt surface is maintained in an optimum configuration by changing the current during the crystal growth while the crystal is pulled up.

14. The semiconductor single crystal growing method according to claim 10, wherein a tip of the electrode is immersed in the semiconductor melt near the surface thereof and is maintained at a constant depth during the crystal growth while the crystal is pulled up.

15. The semiconductor single crystal growing method according to claim 10, wherein the depth of the electrode protecting tube for immersing in the semiconductor melt is kept constant while the crystal is pulled up.

16. The semiconductor single crystal growing method according to claim 10, wherein a ratio of the depth of the electrode protecting tube for immersing in the semiconductor melt to the depth of the melt is kept constant while the crystal is pulled up.

17. The semiconductor single crystal growing method according to claim 10, wherein the rotation rate of the semiconductor melt is varied in the radial direction of the crucible filled with the semiconductor melt or in the direction of depth.

18. The semiconductor single crystal growing apparatus according to claim 1, comprising a device for generating a magnetic field, which is in parallel to a crystal growth interface, and a device for supplying a current in the semiconductor melt in a direction perpendicular to the magnetic field.

19. The semiconductor single crystal growing apparatus according to claim 1, comprising a device for generating a cusped magnetic field and a device for supplying a current in the semiconductor melt in a direction perpendicular to the magnetic field.

20. The semiconductor single crystal growing method according to claim 9, wherein a magnetic field parallel to the crystal growth interface is generated and a current is supplied in the semiconductor melt in a direction perpendicular to the magnetic field.

21. The semiconductor single crystal growing method according to claim 9, wherein a cusped magnetic field is generated and a current is supplied in the semiconductor melt in a direction perpendicular to the magnetic field.

* * * * *